(12) United States Patent
Wu

(10) Patent No.: US 9,288,401 B2
(45) Date of Patent: Mar. 15, 2016

(54) SYSTEM AND METHOD OF RECOGNIZING SIGNAL PATTERNS

(71) Applicant: Wistron Corporation, New Taipei (TW)

(72) Inventor: Chun-Che Wu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 169 days.

(21) Appl. No.: 14/250,393

(22) Filed: Apr. 11, 2014

(65) Prior Publication Data

US 2015/0130994 A1 May 14, 2015

(30) Foreign Application Priority Data

Nov. 13, 2013 (TW) .............................. 102141257 A

(51) Int. Cl.
*H04M 3/22* (2006.01)
*H04N 5/235* (2006.01)
*H04M 1/24* (2006.01)
*G01R 31/01* (2006.01)
*H04M 1/253* (2006.01)

(52) U.S. Cl.
CPC ............... *H04N 5/2354* (2013.01); *H04M 1/24* (2013.01); *H04M 3/22* (2013.01); *G01R 31/01* (2013.01); *H04M 1/2535* (2013.01)

(58) Field of Classification Search
CPC ..... G06T 7/0002; G06T 7/0004; H04M 1/24; H04M 1/2535; H04M 3/22; H04M 3/24; H04M 3/26; G01R 31/02; G01R 31/2635; G01J 2001/4247; G01J 2001/4252
See application file for complete search history.

(56) References Cited

U.S. PATENT DOCUMENTS

2006/0214089 A1* 9/2006 An .............................. 250/214.1
2009/0080611 A1* 3/2009 Ganz et al. ...................... 378/73

FOREIGN PATENT DOCUMENTS

| CN | 102201201 A | * | 9/2011 | ............. G01R 31/02 |
| TW | 201013977 A1 | | 4/2010 | ............. H01L 33/00 |
| TW | 201018886 A1 | * | 5/2010 | ................ G01J 1/16 |

OTHER PUBLICATIONS

Office action mailed on Mar. 3, 2015 for the Taiwan application No. 102141257, filing date: Nov. 13, 2013, p. 1 line 12-14, p. 2 line 1-8 and line 15-26 and p. 3 line 1.

* cited by examiner

*Primary Examiner* — Andrew W Johns
(74) *Attorney, Agent, or Firm* — Winston Hsu; Scott Margo

(57) ABSTRACT

A system of recognizing signal pattern for recognizing a signal pattern of an electronic device includes a determining unit coupled to the electronic device for outputting an operating command to the electronic device according to an operating state, wherein the electronic device generates a light signal according to the operating command, and an image capturing unit coupled between the determining unit and the electronic device for capturing the light signal to generate a first signal pattern to the determining unit, such that the determining unit determines whether the first pattern corresponds to the operating state.

29 Claims, 5 Drawing Sheets

SYSTEM AND METHOD OF RECOGNIZING SIGNAL PATTERNS

BACKGROUND OF THE INVENTION

1. Field of the Invention

The present invention relates to a system and method of recognizing signal patterns, and more particularly, to a system and method of recognizing signal patterns for checking an operation of a status light of an electronic device.

2. Description of the Prior Art

Before shipping out from a manufacturing factory, electronic devices are tested in order to make sure their full functions are ready. Take a voice over Internet protocol phone (hereafter called VoIP phone) for example, a status light of the VoIP phone indicates its phone features to a user by emitting different colors with corresponding flashing frequencies, wherein the phone features can be an incoming call, dialing, hold call, transfer, new call, hang up, shared line, conference, do-not-disturb, and other features. Traditionally, operations of the status light are checked by an operator's visual sense, which could make mistake if the operator is not familiar with the phone features associated with the operations of the status light since the status light emits lights in different ways that sometimes confuses the operator's judgment.

Moreover, if there are different VoIP phones models tested at the same time, it could confuse the operator due to different specification of the VoIP phones models, which increases a risk of wrong test results, and some malfunctioned electronic devices may be shipped out to customers.

Therefore, there is a need to design an automatic testing system for checking the operation of the status light to reduce the risk of wrong test results.

SUMMARY OF THE INVENTION

It is therefore an objective of the present invention to provide a system and method of recognizing signal pattern for checking the operation of the status light of an electronic device.

The present invention discloses a system of recognizing signal patterns for recognizing a signal pattern of an electronic device. The system includes a determining unit coupled to the electronic device for outputting an operating command to the electronic device according to an operating state, wherein the electronic device generates a light signal according to the operating command, and an image capturing unit coupled between the electronic device and the determining unit for capturing the light signal to generate a first signal pattern to the determining unit, such that the determining unit determines whether the first signal pattern is corresponding to the operating state.

The present invention further discloses a method of recognizing signal patterns for recognizing a signal pattern of an electronic device. The method includes outputting an operating command to the electronic device according to an operating state, wherein the electronic device generates a light signal according to the operating command, capturing the light signal to generate a first signal pattern, and determining whether the first signal pattern is corresponding to the operating state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
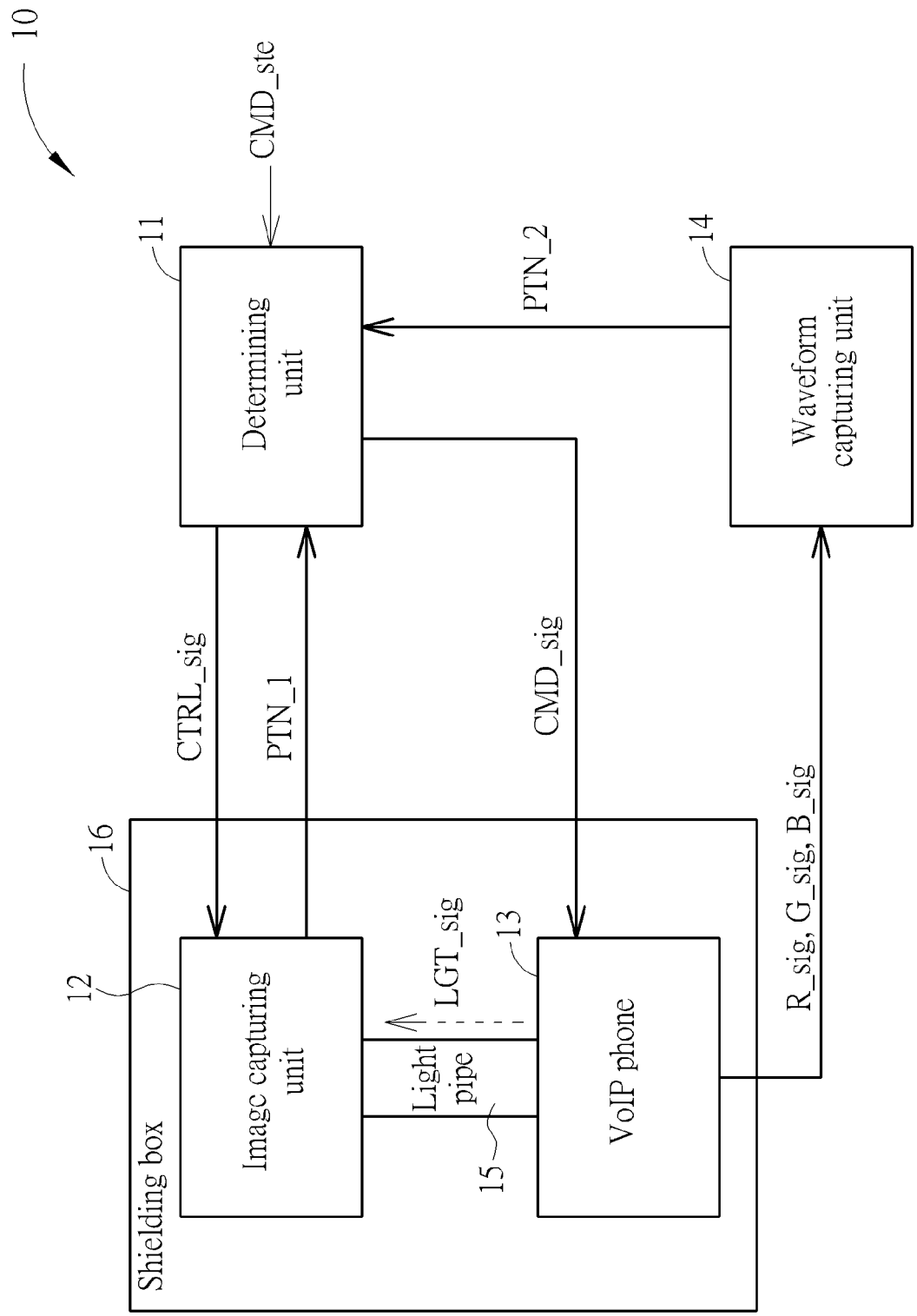
FIG. 1 is a functional block diagram of a system for recognizing signal patterns according to an embodiment of the present invention.

Please refer to FIG. 1, which is a functional block diagram of a system 10 for recognizing signal patterns according to an embodiment of the present invention. The system 10 includes a determining unit 11, an image capturing unit 12, a VoIP phone 13, a light pipe 15 and a shielding box 16. The VoIP phone 13 is not limited from being other types of electronic devices equipped with a status light, such as a personal computer, an access point and household appliances, whose operating features, states or statuses may be indicated to a user by emitting lights with different colors and corresponding flashing frequency. The determining unit 11 is coupled to the VoIP phone 13 for outputting an operating command CMD_sig to the VoIP phone 13 according to an operating state CMD_ste. The VoIP phone 13 may perform a designated operation and generate a corresponding light signal LGT_sig according to the operating command CMD_sig, thereby indicate its operating state to the user. The image capturing unit 12 is coupled between the VoIP phone 13 and the determining unit 11 for capturing the light signal LGT_sig emitted by the VoIP phone 13 to generate a signal pattern PTN_1 to the determining unit 11, such that the determining unit 11 may determine whether the signal pattern PTN_1 is corresponding to the operating state CMD_ste. Preferably, the light pipe 15 is seamlessly coupled between the VoIP phone 13 and the image capturing unit 12 for guiding the light signal LGT_sig. The light pipe 15, the image capturing unit 11 and the VoIP phone 13 are located inside the shielding box 16 to protect the light signal LGT_sig from being interfered with environmental lights, which also prevents the image capturing unit 12 from capturing the distorted signal pattern PTN_1.

Specifically, the determining unit 11 may be realized by a host computer installed with specified programs, such as a soft-phone program, a remote-control program, an operating state database and a color or image analyze program. The soft-phone program and the remote-control program may be utilized for controlling behaviors of the VoIP phone 13, such that the operator may input the operating state CMD_ste by the soft-phone program to control the host computer outputting the operating command CMD_sig to the VoIP phone 13. For example, the soft-phone program may control the VoIP phone 13 to make a call, transfer a call, hang up a call, etc. The remote-control program may control the VoIP phone 13 to enable a number key or a function key according to the operating command CMD_sig. And the operating state database may store configurations or specifications of the status light for the VoIP phones with different models. For example, in the operating state database, the operating state CMD_ste indicates a color, an on or off state and a flashing frequency of the signal pattern PTN_1 (i.e. the light signal LGT_sig).

The image capturing unit 12 is preferably a charge-coupled device (CCD) or a camera for taking pictures or recording videos in order to convert the light signal LGT_sig into images with specific formats, e.g. J-PEG or BitMaP formats, to generate the signal pattern PTN_1. If the image capturing unit 12 generates the signal pattern PTN_1 by taking pictures, the determining unit 11 may output a control signal CTRL_sig to the image capturing unit 12 according to the operating state CMD_ste to control a capturing frequency of the image capturing unit 12. Therefore, the flashing frequency of the light signal LGT_sig may be corresponding to the capturing frequency of the image capturing unit 12, which allows the image capturing unit 12 to continuously take pictures of the signal pattern PTN_1 when the light signal LGT_sig is flashing. In addition, the determining unit 11 may output the control signal CTRL_sig to the image capturing unit 12 to control the image capturing unit 12 when to start and stop taking pictures and recording videos. After the determining unit 11 receives the signal pattern PTN_1, the image analyze program may analyze the color, the on or off state and the flashing frequency of the signal pattern PTN_1 to determine whether the signal pattern PTN_1 is corresponding to the operating state CMD_ste.

On the other hand, the VoIP phone 13 further generates color signals R_sig, G_sig and B_sig for driving the status light according to the operating command CMD_sig. In such a situation, the system 10 further includes a waveform capturing unit 14. The waveform capturing unit 14 is coupled between the determining unit 11 and VoIP phone 13 for capturing waveforms of the color signals R_sig, G_sig and B_sig to generate a signal pattern PTN_2 to the determining unit 11, such that the determining unit 11 may determine whether the signal pattern PTN_2 is corresponding to the operating state CMD_ste. Therefore, in the operating state database, the operating state CMD_ste further indicates a voltage peak, a duty cycle and a switching frequency of the signal pattern PTN_2 (i.e. the waveforms of the color signal R_sig, G_sig and B_sig).

The waveform capturing unit 14 may be realized but not limited to by a software program to be installed in and executed by the host computer, i.e. the determining unit 11. Alternatively, the waveform capturing unit 14 may be realized by a hardware device, e.g. an oscilloscope. The waveform capturing unit 14 is used for converting the waveforms of the color signals R_sig, G_sig and B_sig into images with specific formats, e.g. the J-PEG or the BitMaP formats, to generate the signal pattern PTN_2. After the determining unit 11 receives the signal pattern PTN_2, the image analyze program may analyze the voltage peak, the duty cycle and the switching frequency of the signal pattern PTN_2 to determine whether the signal pattern PTN_2 is corresponding to the operating state CMD_ste.

In other words, the system 10 captures two kinds of signal patterns PTN_1 and PTN_2 simultaneously corresponding to the single operating state CMD_ste, to cross verify whether the status light of the electronic device operates correctly. One approach is that the image capturing unit 12 and the light pipe 15 cooperates to be regarded as an artificial eye to achieve the visual sense of the operator and capture the light signal LGT_sig emitted from a surface of the status light. The other approach is that the waveform capturing unit 14 captures the waveforms of the color signals R_sig, G_sig and B_sig for driving the status light. As a result, the determining unit 11 may cross verify whether both of the signal patterns PTN_1 and PTN_2 are corresponding to the operating state CMD_ste according to information indicated in the operating state database, to determine whether the status light of the electronic device operates correctly.

As a result, other than checking the operation of the status light by the operator's visual sense, the signal pattern recognizing system of the present invention may take place of the operator's visual sense to capture two kinds of the signal patterns PTN_1 and PTN_2 to cross verify whether both of the signal patterns PTN_1 and PTN_2 are corresponding to the operating state CMD_ste, which reduces the risk of wrong test results due to the operator is not familiar with the phone features associated with the operations of the status light.

Figure 2:
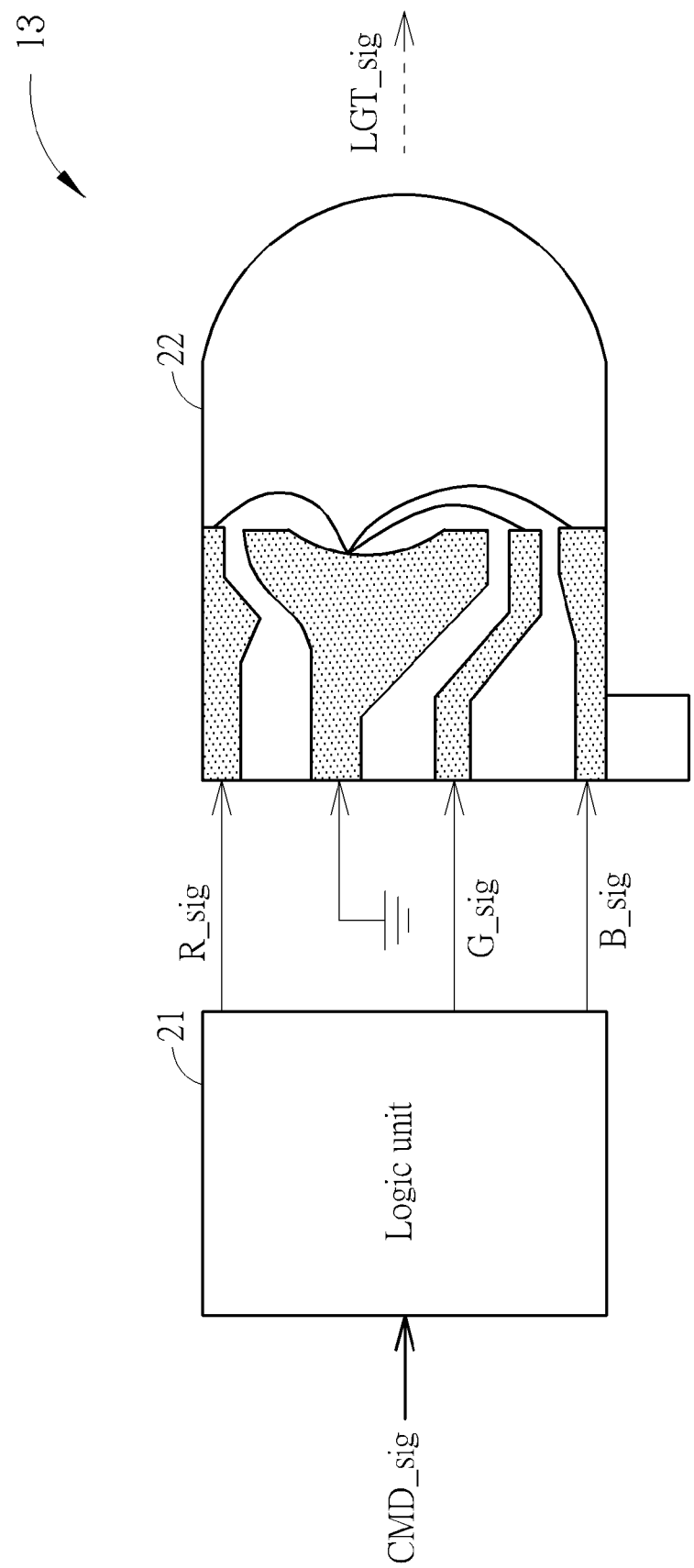
FIG. 2 illustrates a partial appearance of the VoIP phone shown in FIG. 1.

Please refer to FIG. 2, which illustrates a partial appearance of the VoIP phone 13 shown in FIG. 1. The VoIP phone 13 includes a logic unit 21 and a light emitting unit 22. The logic unit 21 is coupled to the determining unit 11 for generating the color signals R_sig, G_sig and B_sig according to the operating command CMD_sig. The light emitting unit 22 is coupled to the waveform capturing unit 14, logic unit 21 and a ground terminal for generating the light signal LGT_sig according to the color signals R_sig, G_sig and B_sig. The light emitting unit 22 may be regarded as the status light of the VoIP phone 13, and the light emitting unit 22 is preferably but not limited to a light emitting diode (LED). When the logic unit 21 respectively outputs one of the color signals R_sig, G_sig and B_sig having a high logic voltage, the light emitting unit 22 may be driven to respectively generate the red, green or blue light signal LGT_sig. When the logic unit 21 outputs both of the color signals R_sig and G_sig having the high logic voltage, the light emitting unit 22 may be driven to generate the orange light signal LGT_sig because a combination of red and green lights produces an orange light. Likewise, the logic unit 21 may output different combinations of color signals to produce the light signal LGT_sig having different colors.

Figure 3:
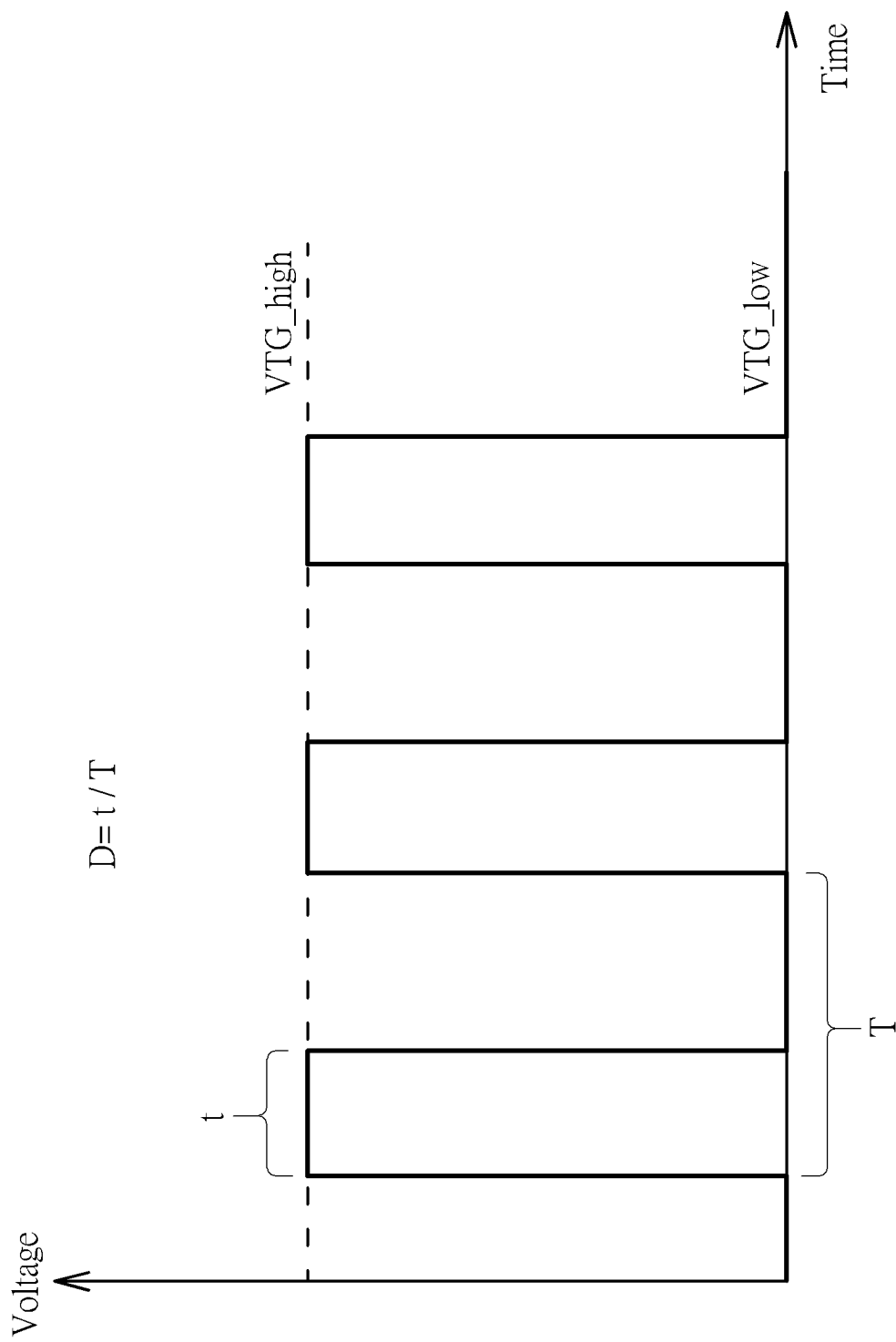
FIG. 3 illustrates a waveform of a color signal according to an embodiment of the present invention.

Please refer to FIG. 3, which illustrates a waveform of a color signal according to an embodiment of the present invention. As shown in FIG. 3, the voltage peak of the waveform of the operating state CMD_ste may be a high logic voltage VTG_high or a low logic voltage VTG_low, wherein a duty cycle D is denoted with t/T, a switching frequency is denoted with 1/T. Operations about the light emitting unit 22 driven by the waveform are well known in the art, which is omitted.

Figure 4:
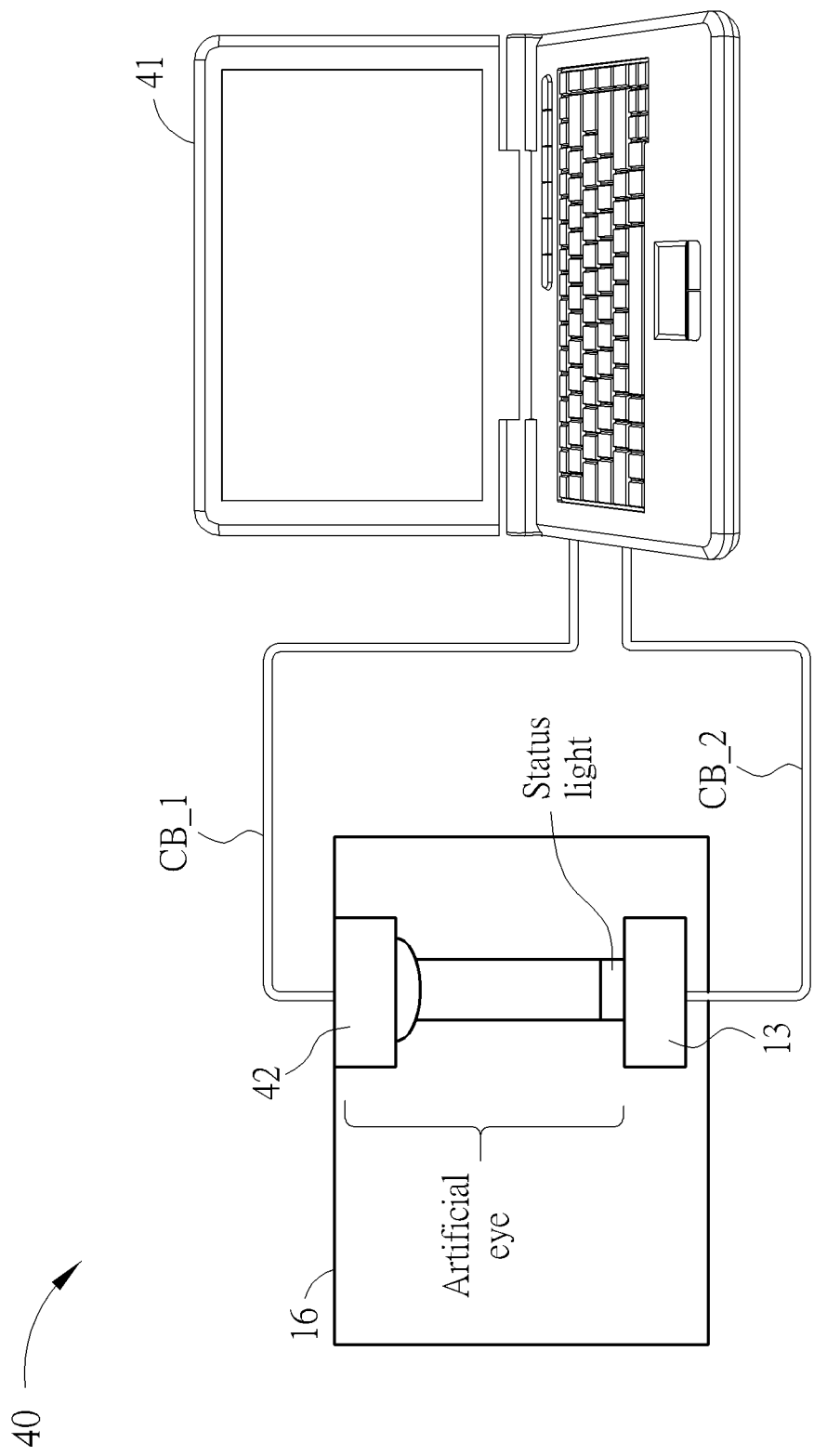
FIG. 4 is a schematic diagram of a system of recognizing signal patterns according to another embodiment of the present invention.

Please refer to FIG. 4, which is a schematic diagram of a system of recognizing signal pattern 40 according to another embodiment of the present invention. In FIG. 4, a host computer 41 functions as a combination of the determining unit 11 and the waveform capturing unit 14 shown in FIG. 1, and a camera 42 functions as the image capturing unit 12 shown in FIG. 1. A transmission line CB_1 is coupled between the camera 42 and the host computer 41 for transmitting the signal pattern PTN_1 and the control signal CTRL_sig. A transmission line CB_2 is coupled between the VoIP phone 13 and the host computer 41 for transmitting the operating command CMD_sig and the color signals R_sig, G_sig and B_sig. In practice, the host computer 41 may connect to multiple VoIP phones at the same time by the transmission lines CB_1 and CB_2 to simultaneously test the operations of the status light to speed up manufacturing products.

In operation, a first embodiment of the present invention is assumed to test the status light when there is an incoming call to the VoIP phone 13. The VoIP phone 13 is set as shown in FIG. 4, and the operator controls the host computer 41 to output the control signal CTRL_sig to the camera 42 for taking pictures. The camera 42 generates one image per 0.05 seconds to output the signal pattern PTN_1 to the host computer 41. The operator then makes a call to the VoIP phone 13 by the host computer 41. In such a situation, the status light of the VoIP phone 13 emits a flashing orange light signal LGT_sig according to the operating command CMD_sig, and a flashing frequency of the orange light signal LGT_sig is light-on for one second and light-off for the following second (i.e. 0.5 Hertz). The host computer 41 then receives the images of the signal pattern PTN_1 to analyze color codes, e.g. RGB color codes, of the images. The color code of the image is FFA500 when the orange light signal LGT_sig is light-on, and the color code of the image is 000000 when the orange light signal LGT_sig is light-off. Since the camera 42 generates one image per 0.05 seconds, the color codes of the images generated by the camera 42 during a first second are FFA500 (twenty pictures), and the color codes of the images generated by the camera 42 during a following second are 000000 (another twenty pictures), and the color codes change to FFA500 for the following third second. And so forth, the camera 42 continuously generates images until the host computer 41 outputs the operating command CMD_sig to pick up or hang up the incoming call, and the host computer 41 then outputs the control signal CTRL_sig to stop the camera 42.

Meanwhile, the host computer 41 captures the waveforms of the color signal R_sig, G_sig and B_sig to generate the signal pattern PTN_2. When the orange light signal LGT_sig is light-on during the first second, the voltage peaks of the waveforms for the color signals R_sig and G_sig are VTG_high; while when the orange light signal LGT_sig is light-off during the following second, the voltage peaks of the waveforms for the color signals R_sig and G_sig are VTG_low. The voltage peak of the waveform of the color signal B_sig is always VTG_low. Therefore, the host computer 41 continuously captures the waveforms until the incoming call is picked up or hung up.

As a result, the host computer 41 may analyze the color codes of the images and count a number of serial images having a same color code when receiving the images of the signal pattern PTN_1, to determine whether the signal pattern PTN_1 is corresponding to the operating state CMD_ste. Meanwhile, the host computer 41 may measure the voltage peak and analyze the switching frequency of the captured waveforms when receiving the signal pattern PTN_2, to determine whether the signal pattern PTN_2 is corresponding to the operating state CMD_ste. Therefore, the signal pattern recognizing system 40 may automatically capture two kinds of the signal patterns PTN_1 and PTN_2 to cross verify whether both of the signal patterns PTN_1 and PTN_2 are corresponding to the operating state CMD_ste, to check whether the status light of the VoIP phone 13 operates correctly.

Noticeably, the status light of the VoIP phone 13 operates correctly if both of the signal patterns PTN_1 and PTN_2 are corresponding to the operating state CMD_ste. If the signal pattern PTN_1 is not corresponding to the operating state CMD_ste, but the signal pattern PTN_2 is corresponding to the operating state CMD_ste, the logic unit 21 of the VoIP phone 13 operates correctly but the light emitting unit 22 is probably malfunctioning due to damage or misassembled by the operator. If the signal pattern PTN_2 is not corresponding to the operating state CMD_ste, the logic unit 21 of VoIP phone 13 is probably malfunctioning due to damage or wrong configurations and causing the signal pattern PTN_1 to not correspond to the operating state CMD_ste. Therefore, test results of the system 40 may be references for fail analysis by cross verifying the signal patterns PTN_1 and PTN_2.

A second embodiment of the present invention is assumed to test the status light when a function key of "new call" is enabled and followed by enabling a function key of "hang up". The operator controls the host computer 41 to output the control signal CTRL_sig to the camera 42 for taking pictures. The camera 42 generates one image per 0.05 seconds to output the signal pattern PTN_1 to the host computer 41. The operator then remotely controls the VoIP phone to enable the function key of "new call" by the host computer 41. Once the function key of "new call" is enabled, the status light of the VoIP phone 13 emits a solid green light signal LGT_sig, and the camera 42 generates twenty pictures having a color code to be 008000 per second to the host computer 41. Once the function key of "hang up" is enabled, the light emitting unit 22 is turned off such that the light signal LGT_sig turns to be black, and the camera 42 generates twenty pictures having a color code to be 000000 per second to the host computer 41.

Meanwhile, the host computer 41 captures the waveforms of the color signal R_sig, G_sig and B_sig to generate the signal pattern PTN_2. When the green light signal LGT_sig is light-on, the voltage peaks of the waveform for the color signal G_sig is VTG_high. When the green light signal LGT_sig is light-off, the voltage peak of the waveform for the color signal G_sig is VTG_low. The voltage peaks of the waveforms of the color signals R_sig and B_sig are always VTG_low. The host computer 41 continuously captures the waveforms until the function key of "hang up" is enabled and the camera 42 is stopped. Therefore, the system 40 may automatically capture two kinds of signal patterns PTN_1 and PTN_2 to cross verify whether both of the signal patterns PTN_1 and PTN_2 are corresponding to the operating state CMD_ste, thereby checks the operation of the status light of the VoIP phone 13.

A third embodiment of the present invention is assumed to test the status light when the VoIP phone 13 has a call on hold. The operator controls the host computer 41 to output the control signal CTRL_sig to the camera 42 for taking pictures. The camera 42 generates one image per 0.05 seconds to output the signal pattern PTN_1 to the host computer 41. The operator then makes a call to the VoIP phone 13 and enables a function key of "hold" by the host computer 41. When the function key of "hold" is enabled, the status light of the VoIP phone 13 emits a flashing green light signal LGT_sig, and a flashing frequency of the green light signal LGT_sig is light-on for one second and light-off for the following one second. The camera 42 generates twenty pictures having a color code to be 008000 for a first second, twenty pictures having a color code to be 000000 for the following second to the host computer 41, and twenty pictures having the color code to be 008000 for a third second, to the host computer 41.

Meanwhile, the host computer 41 captures the waveforms of the color signals R_sig, G_sig and B_sig to generate the signal pattern PTN_2. When the green light signal LGT_sig is light-on during the first second, the voltage peak of the waveform for the color signals G_sig is VTG_high. When the green light signal LGT_sig is light-off during the following second, the voltage peak of the waveform for the color signals G_sig is VTG_low. The voltage peaks of the waveforms of the color signals R_sig and B_sig are always VTG_low. The host computer 41 continuously captures the waveforms until the call on hold is picked up or hung up to stop capturing the waveforms. Therefore, the system 40 may automatically capture two kinds of signal patterns PTN_1 and PTN_2 to cross verify whether both of the signal patterns PTN_1 and PTN_2 are corresponding to the operating state CMD_ste, thereby checks the operation of the status light of the VoIP phone 13.

Figure 5:
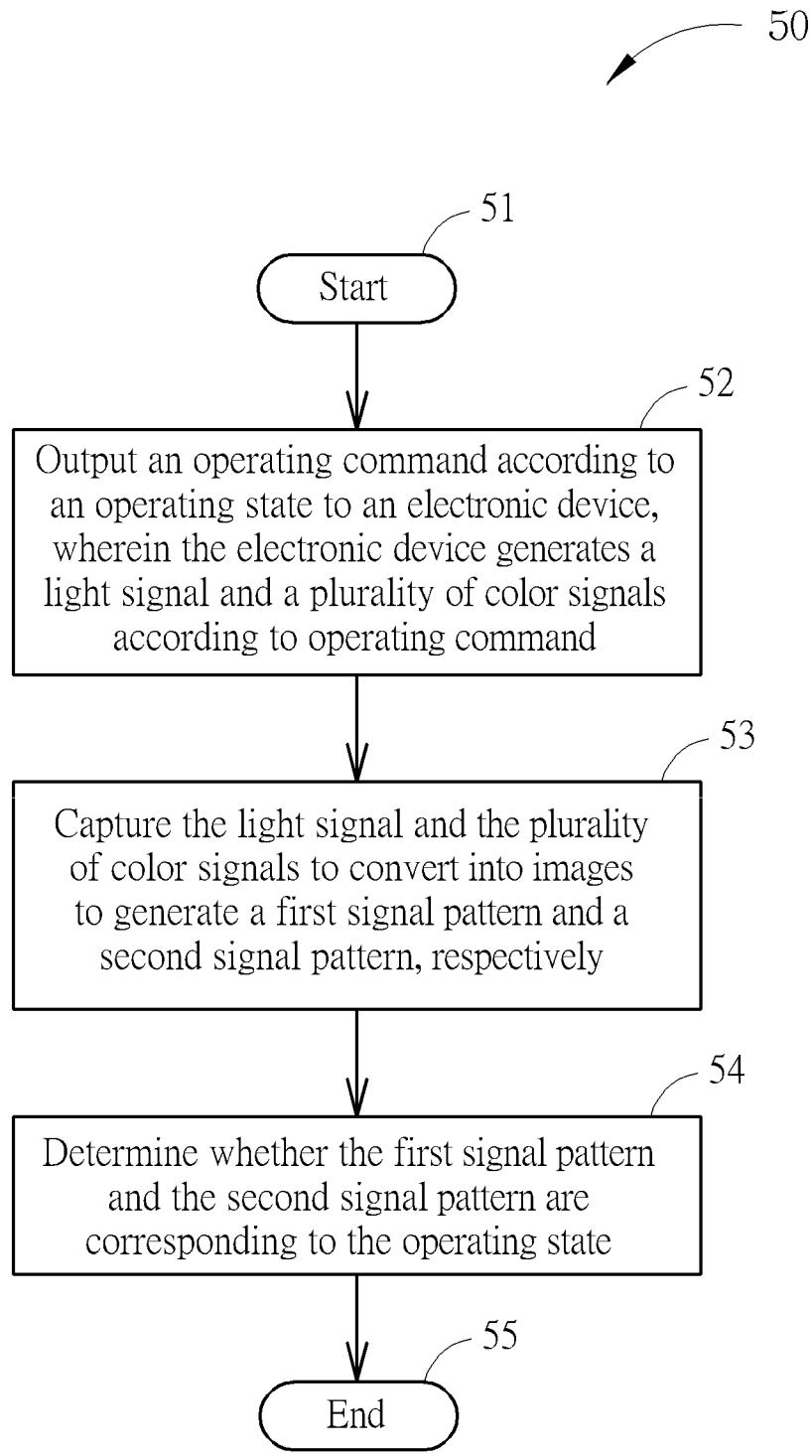
FIG. 5 is a flow chart of a process according to an embodiment of the present invention.

Please refer to FIG. 5, which is a flow chart of a process 50 according to an embodiment of the present invention. The process 50 may be utilized in the system 10 shown in FIG. 1 for checking the operation of the status light of VoIP phone 13. The process 50 includes the following steps:

Step 51: Start.

Step 52: Output an operating command according to an operating state to an electronic device, wherein the electronic device generates a light signal and a plurality of color signals according to operating command.

Step 53: Capture the light signal and the plurality of color signals to convert into images to generate a first signal pattern and a second signal pattern, respectively.

Step 54: Determine whether the first signal pattern and the second signal pattern are corresponding to the operating state.

Step 55: End.

Steps 52 and 54 are operations of the determining unit 11, Step 53 is an operation of the image capturing unit 12 cooperating with the waveform capturing unit 14. Detailed descriptions of elements and signals mentioned in the process 50 may be obtained by referring to descriptions of the systems 10 and 40, which is omitted here. By performing the process 50, the systems 10 and 40 may take place of the visual sense of the operator to automatically capture two kinds of signal patterns to cross verify whether both of the signal patterns are corresponding to the operating state, which reduces the risk of wrong test results due to the operator not being familiar with the phone features associated with the operations of the status light.

To sum up, other than checking the operation of the status light by the operator's visual sense, the signal pattern recognizing system of the present invention may take place of the operator's visual sense to capture two kinds of signal patterns to cross verify whether both of the signal patterns are corresponding to the operating state, which reduces the risk of wrong test results due to the operator not being familiar with the phone features associated with the operations of the status light. In addition, the test results of the system 40 may be references for fail analysis by cross verifying the two kinds of signal patterns.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system of recognizing signal patterns for recognizing a signal pattern of an electronic device, comprising:
   a determining unit coupled to the electronic device for outputting an operating command to the electronic device according to an operating state, wherein the electronic device generates a light signal according to the operating command; and
   an image capturing unit coupled between the electronic device and the determining unit for capturing the light signal to generate a first signal pattern to the determining unit, such that the determining unit determines whether the first signal pattern is corresponding to the operating state.

2. The system of recognizing signal patterns of claim 1, wherein the determining unit outputs a control signal to the image capturing unit according to the operating state to control a capturing frequency of the image capturing unit.

3. The system of recognizing signal patterns of claim 1, wherein the image capturing unit is used for converting the light signal into an image to generate the first signal pattern, and the determining unit receives the first signal pattern to analyze a color, an on or off state and a flashing frequency of the first signal pattern by a color analyzing program.

4. The system of recognizing signal patterns of claim 3, wherein the determining unit determines whether the first signal pattern is corresponding to the operating state according to a color code of the image.

5. The system of recognizing signal patterns of claim 3, wherein the operating state indicates the color, the on or off state and the flashing frequency of the first signal pattern signal.

6. The system of recognizing signal patterns of claim 5, wherein the flashing frequency of the first signal pattern signal is corresponding to a capturing frequency of the image capturing unit.

7. The system of recognizing signal patterns of claim 1, further comprising a light pipe coupled between the electronic device and the image capturing unit for guiding the light signal.

8. The system of recognizing signal patterns of claim 1, further comprising:
   a shielding box in which a light pipe, the image capturing unit and the electronic device are located;
   a first transmission line coupled between the image capturing unit and the determining unit for transmitting the first signal pattern and a control signal; and
   a second transmission line coupled between the electronic device and the determining unit for transmitting the operating command and a plurality of color signals.

9. The system of recognizing signal patterns of claim 1, further comprising a waveform capturing unit coupled between the determining unit and the electronic device for capturing a plurality of color signals to generate a second signal pattern to the determining unit, such that the determining unit determines whether the second signal pattern is corresponding to the operating state.

10. The system of recognizing signal patterns of claim 9, wherein the waveform capturing unit is used for converting waveforms of the plurality of color signals into an image to generate the second signal pattern, and the determining unit receives the second signal pattern to analyze a voltage peak, a duty cycle and a switching frequency of the second signal pattern by an image analyzing program.

11. The system of recognizing signal patterns of claim 10, wherein the operating state indicates the voltage peak, the duty cycle and the switching frequency of the second signal pattern signal.

12. The system of recognizing signal patterns of claim 9, wherein the electronic device
   generates the plurality of color signals according to the operating command; and the electronic device comprises
   a light emitting unit coupled to the waveform capturing unit and a ground terminal for generating the light signal according to the plurality of color signals.

13. The system of recognizing signal patterns of claim 12, wherein the light emitting unit is a status light of the electronic device, and the light emitting unit is a light emitting diode.

14. The system of recognizing signal patterns of claim 1, wherein the electronic device is a voice over Internet protocol phone.

15. The system of recognizing signal patterns of claim 14, wherein the operating state is incoming call, dialing, hold call, transfer, new call, hang up, shared line, conference and do-not-disturb.

16. The system of recognizing signal patterns of claim 14, wherein the voice over Internet protocol phone enables a number key or a function key according to the operating command.

17. A method of recognizing signal patterns for recognizing a signal pattern of an electronic device, comprising:
outputting an operating command to the electronic device according to an operating state, wherein the electronic device generates a light signal according to the operating command;
capturing the light signal to generate a first signal pattern; and
determining whether the first signal pattern is corresponding to the operating state.

18. The method of claim 17, wherein outputting the operating command according to the operating state comprising:
outputting a control signal according to the operating state to control a capturing frequency.

19. The method of claim 17, wherein capturing the light signal to generate the first signal pattern comprises:
converting the light signal into an image to generate the first signal pattern; and
analyzing a color, an on or off state and a flashing frequency of the first signal pattern by a color analyzing program.

20. The method of claim 19, wherein determining whether the first signal pattern is corresponding to the operating state comprises:
determining whether the first signal pattern is corresponding to the operating state according to a color code of the image.

21. The method of claim 19, wherein the operating state indicates the color, the on or off state and the flashing frequency of the first signal pattern signal.

22. The method of claim 21, wherein the flashing frequency of the first signal pattern signal is corresponding to a capturing frequency of the image capturing unit.

23. The method of claim 17, further comprising:
capturing a plurality of color signals to generate a second signal pattern; and
determining whether the second signal pattern is corresponding to the operating state.

24. The method of claim 23, wherein capturing the plurality of color signals to generate the second signal pattern comprises:
converting waveforms of the plurality of color signals into an image to generate the second signal pattern; and
analyze a voltage peak, a duty cycle and a switching frequency of the second signal pattern by an image analyzing program.

25. The method of claim 24, wherein the operating state indicates the voltage peak, the duty cycle and the switching frequency of the second signal pattern signal.

26. The method of claim 23, further comprising:
generating the plurality of color signals according to the operating command; and
generating the light signal according to the plurality of color signals.

27. The method of claim 17, wherein the electronic device is a voice over Internet protocol phone.

28. The method of claim 27, wherein the operating state is incoming call, dialing, hold call, transfer, new call, hang up, shared line, conference and do-not-disturb.

29. The method of claim 27, wherein the voice over Internet protocol phone enables a number key or a function key according to the operating command.

* * * * *